United States Patent [19]
Suzuki

[11] Patent Number: 5,099,152
[45] Date of Patent: Mar. 24, 1992

[54] SUPERCONDUCTING CIRCUIT HAVING AN OUTPUT CONVERSION CIRCUIT

[75] Inventor: Hideo Suzuki, Yokohama, Japan
[73] Assignee: Fujitsu Limited, Kawasaki, Japan
[21] Appl. No.: 651,528
[22] Filed: Feb. 6, 1991

[30] Foreign Application Priority Data

Feb. 6, 1990 [JP] Japan .................................. 2-026626
Oct. 12, 1990 [JP] Japan .................................. 2-273900

[51] Int. Cl.⁵ .......................................... H03K 19/195
[52] U.S. Cl. ..................................... 307/476; 307/306
[58] Field of Search ................. 307/476, 475, 245, 306

[56] References Cited

U.S. PATENT DOCUMENTS

| | | | |
|---|---|---|---|
| 4,559,459 | 12/1985 | Wang et al. | 307/306 |
| 4,672,244 | 6/1987 | Harada et al. | 307/476 |
| 4,897,558 | 1/1990 | Tidman | 307/306 |
| 4,956,642 | 9/1990 | Harada | 307/306 |
| 4,980,580 | 12/1990 | Ghoshal | 307/476 |

FOREIGN PATENT DOCUMENTS 284679 of 1986 Japan .
98807 of 1990 Japan .

Primary Examiner—Edward P. Westin
Assistant Examiner—Andrew Sanders
Attorney, Agent, or Firm—Staas & Halsey

[57] ABSTRACT

A superconducting circuit for performing a logic operation and producing an output indicative of the result of the logic operation with a logic amplitude suitable for processing by an external circuit, is provided by a Josephson processing circuit which performs the logic operation and produces an output logic signal with a first logic amplitude, a voltage amplification circuit which is supplied with the output logic signal from the Josephson processing circuit and produces an output signal having a second logic amplitude which is substantially larger than the first logic amplitude, and an impedance conversion circuit which is supplied with the output signal of the voltage amplification means and produces the output of the superconducting circuit, with an output impedance suitable for transferring to the external circuit. The voltage amplification circuit includes a plurality of superconducting quantum devices connected in series and produces the output signal of the second logic amplitude as a sum of the voltage transitions caused in response to the respective transitions of the Josephson junctions included therein. The impedance conversion circuit provides a high input impedance such that the operation of the voltage amplification circuit is not influenced by the current associated with the output signal to the impedance conversion circuit.

10 Claims, 17 Drawing Sheets

FIG. 2(A) PRIOR ART
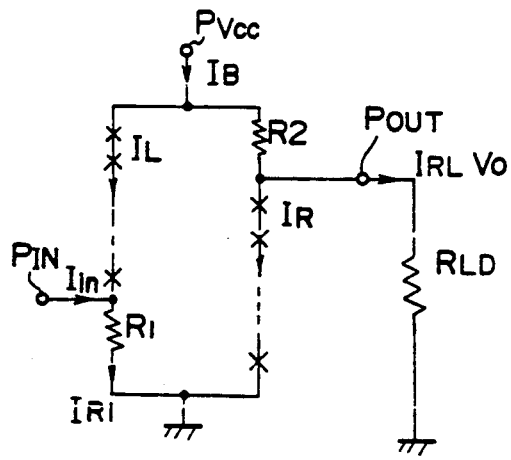
FIG. 2(B) PRIOR ART
FIG. 2(C) PRIOR ART
FIG. 2(D) PRIOR ART
FIG. 2(E) PRIOR ART
FIG. 2(F) PRIOR ART
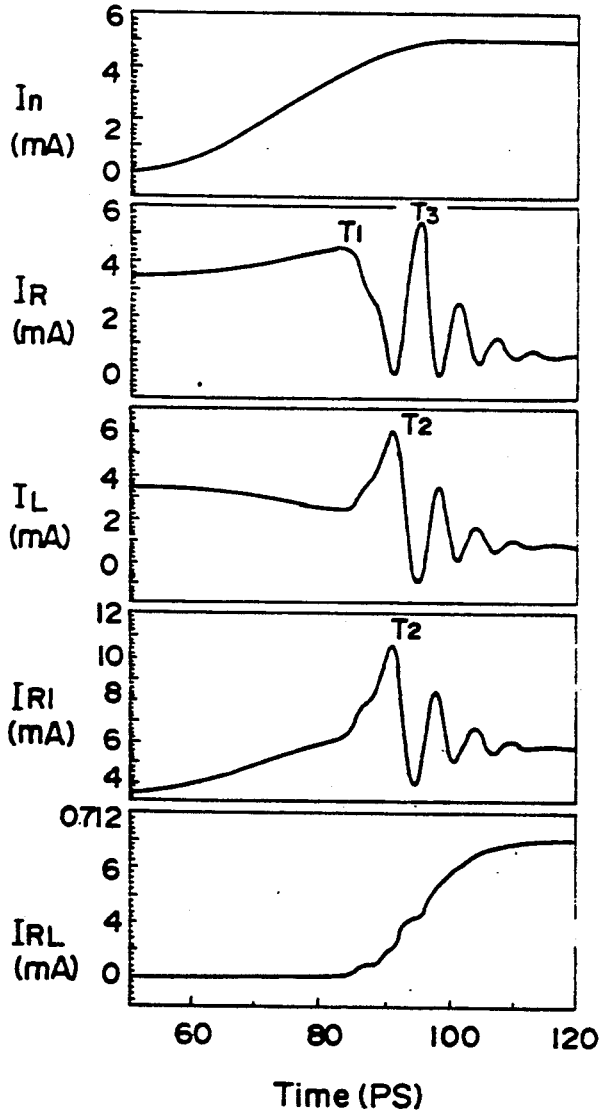

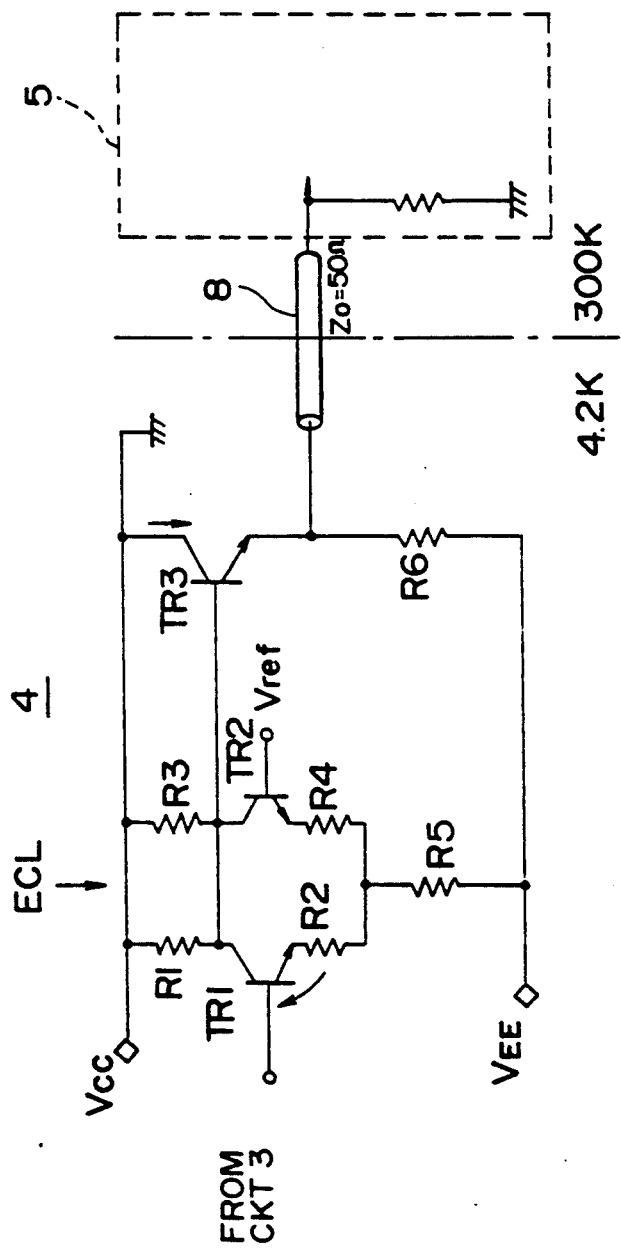

SUPERCONDUCTING CIRCUIT HAVING AN OUTPUT CONVERSION CIRCUIT

BACKGROUND OF THE INVENTION

The present invention generally relates to superconducting circuits having Josephson devices, and more particularly to a superconducting circuit that includes an output conversion circuit for converting an output of the superconducting circuit to a signal suitable for use in a semiconductor processor.

Superconducting circuits that use the Josephson devices generally produce output logic signals with a logic amplitude determined by the gap energy pertinent to the material used for the Josephson junction. When using niobium (Nb), a typical material for the Josephson junction, for this purpose, a logic amplitude of about 3 mV is obtained. Although this small logic amplitude may be advantageous for reducing the power consumption, this level of logic amplitude is too small for driving the semiconductor circuits that operate in the room temperature environment. It should be noted that the Josephson circuits require an extremely low temperature environment for operation, and for this purpose, a low temperature vessel containing the cooling medium such as liquid helium, is used for accommodating the Josephson circuits. Thus, a processing circuit operating at the room temperature environment is essential for taking over and processing the output of Josephson processors. Generally, a logic amplitude of about several hundred millivolts is necessary for such a processing circuit. For example, when a CMOS device is used for this purpose, the necessary logic amplitude for driving the CMOS device is about 1.5 volts. When using a GaAs FET, on the other hand, the preferred logic amplitude is about 800 mV. When a bipolar transistor is used, the preferred logic amplitude is about 400 mV.

Thus, when the Josephson processor supplies the output directly to these semiconductor processing circuits, the semiconductor processing circuits may not operate properly or at all. Even when operated properly, such a system is extremely vulnerable to external noises. Thus, there is an acute demand for a superconducting output driver that is capable to operating in the low temperature environment together with the Josephson processor as a part of the Josephson integrated circuit for converting the logic amplitude of the Josephson processor to a level suitable for processing by the semiconductor circuits.

FIG. 1 shows a conventional superconducting output driver 10 proposed in the Japanese Laid-open Patent Application No. 61-171551. Referring to FIG. 1, the circuit comprises a first junction group 11 including a plurality of Josephson junctions J11, J12, ... ,J1n connected in series, a second junction group 12 including a plurality of Josephson junctions J21, J22, ... , a first resistant R1 connected in series to the first junction group 11, and a second resistance R2 identical with the first resistance R1 and connected in series to the second junction group 12, wherein the junction group 11 and the resistance R1 form a first branch of a bridge circuit, and the junction group 12 and the resistance R2 form a second branch of the bridge circuit. The driver 10 is injected with a drive current Ib at a terminal PVcc connected to a neutral node of the bridge, and the Josephson junctions in the junction groups 11 and 12 have a critical current Is that is identical in each Josephson junction.

In operation, the bias current Ib supplied at the terminal PVcc is divided and caused to flow through the first and second branches with a magnitude identical in the first and second branches. Thus, a current Ib/2 flows through the first and second branches. As long as the current Ib/2 is smaller than the critical current of the Josephson junctions included in the branch, the junction groups 11 and 12 maintain the superconducting state.

When an input current Iin is supplied in this state to an input terminal Pin connected to a node between the junction group 11 and the resistance R1, the current Iin is caused to flow through a path indicated in FIG. 1 by a dotted line, and a current with the magnitude of Iin/2+Ib/2 is caused to flow through the second branch while a current with the magnitude of −Iin/2+Ib/2 flows through the first branch. Thus, when the magnitude Iin/2+Ib/2 in the second branch exceeds the critical current of at least some of the Josephson junctions in the second junction group 12, these Josephson junctions experience a transition to the finite voltage state and there appears a resistance in the second branch. In response to the appearance of the resistance, the drive current Ib/2 hitherto flowing through the second branch is now diverted to the first branch. Thereby, an overshoot of the current Ib flowing through the first junction group 11 occurs and the Josephson junctions J11–J1n in the first group 11 are all switched to the finite voltage state. Further, in response to the switching of the Josephson junctions J11–J1n, all the Josephson junctions J21–J2n are switched to the finite voltage state and a voltage corresponding to the number of stages of the Josephson junctions multiplied by the energy gap of each Josephson junction appears at an output terminal Pout connected to the node between the resistance R2 and the second junction group 12.

FIGS. 2(A)–2(F) show the above described operation wherein FIG. 2(A) defines the parameters in the circuit of FIG. 1 and FIGS. 2(B)–2(F) are waveforms appearing in correspondence to the foregoing operations.

With the rise of the input current Iin at the input terminal Pin as shown in FIG. 2(B), the current IR flowing through the second branch increases and some of the Josephson junctions start to switch to the finite voltage state with a timing designated as T1. After the timing T1, the current IR drops sharply while the current IL flowing through the first branch experiences a surge at a time T2 as shown in FIG. 2(D). In correspondence to the surge in the current IL, the current IR1 flowing through the first resistance R1 expererinces a corresponding maximum as shown in FIG. 2(E). In response to the surge of the current IL, all the Josephson junctions in the first branch cause the switching to the finite voltage state and the current IR again increases as shown in a large peak at the timing T3 as shown in FIG. 2(B). Thereby, all the Josephson junctions in the second branch experience the switching to the finite voltage state and the output voltage corresponding to the gap voltage multiplied by the number of series-connected Josephson junctions appear at the output terminal Pout. In correspondence to this, the output current IRL to a load RLD increases as shown in FIG. 2(F).

In this conventional driver, however, there exits a problem, when a semiconductor processing circuit is connected to the output terminal Pout, such that the current IL or IR supposed to cause the switching of the Josephson junctions is diverted to the semiconductor circuit forming the load RLD because of the low input impedance of the semiconductor circuits. It should be noted that such a loss of the current in the bridge circuit at the time T2 or T3 corresponding to the transition of the Josephson junctions causes an operational instability of the output driver. Further, there is another problem, caused by the large number of Josephson junctions connected in series, such that the expected overshoot of the current at the time T2 or T3 may not occur with sufficient magnitude when there is a large number of Josephson junctions and corresponding large but unpredictable parasitic inductance in the first and second branches. Thus, the conventional circuit of FIG. 1 has suffered from a problem of insufficient reliability.

SUMMARY OF THE INVENTION

Accordingly, it is a general object of the present invention to provide a novel and useful superconducting circuit wherein the previously described problems are eliminated.

Another and more specific object of the present invention is to provide a superconducting circuit having an output driver circuit for increasing the logic amplitude of the output of the superconducting circuit, wherein the reliability in the operation of the output driver circuit is improved.

Another object of the present invention is to provide a superconducting circuit comprising a Josephson processor for carrying out a predetermined logic operation and an output driver circuit supplied with an output logic signal of the Josephson processor for producing an output signal with an increased logic amplitude, wherein the output driver circuit comprises a voltage multiplier circuit supplied with the output logic signal from the Josephson processor for multiplying the logic amplitude thereof, said voltage multiplier circuit including one or more Josephson junctions, and an impedance conversion circuit having an input terminal connected to the output driver circuit for receiving the output signal for the voltage multiplier circuit, said impedance conversion circuit having a high impedance such that the operation of the voltage multiplier circuit is not influenced by the current that flows to the impedance conversion circuit.

According to the present invention, a large output voltage sufficient to drive a semiconductor circuit is obtained from the impedance conversion circuit without causing an adverse effect in the operation of the multiplier circuit. Thereby, a reliable conversion of the voltage can be achieved.

Other objects and further features of the present invention will become apparent from the following detailed description when read in conjunction with the attached drawings.

BRIEF DESCRIPTION OF THE DRAWINGS

FIGS. 2(A)-2(F) are diagrams showing the definition of parameters in the circuit of FIG. 1 (FIG. 2(A)) and various transient characteristics (FIGS. 2(B)-2(F)) of the circuit of FIG. 1;

FIG. 17 is a circuit diagram showing a tenth embodiment of the present invention also about the impedance conversion part.

DETAILED DESCRIPTION

Figure 1:
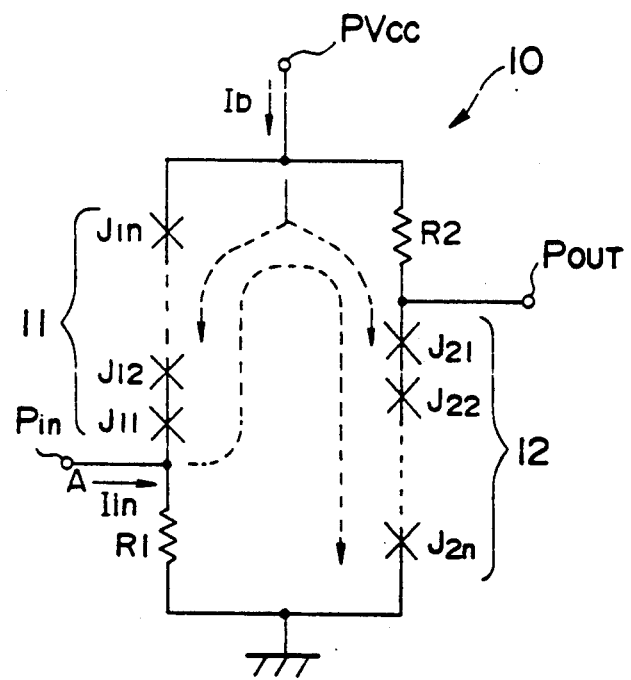
FIG. 1 is a circuit diagram showing the construction of a conventional output driver circuit used for converting the logic amplitude of a Josephson processor.
Figure 3:
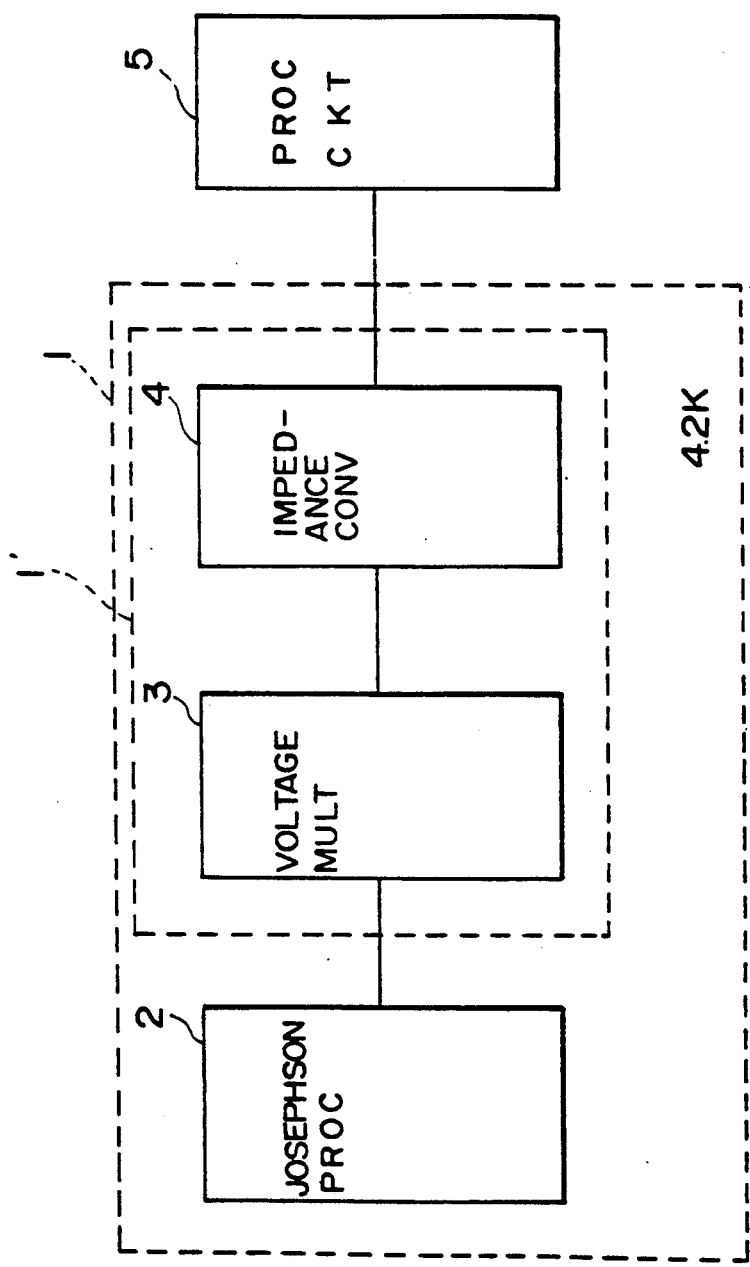
FIG. 3 is a diagram showing the overall construction of the superconducting circuit according to the present invention.

FIG. 3 shows the general construction of a superconducting circuit 1 according to the present invention. Referring to FIG. 3, the superconducting circuit 1 comprises a Josephson processor 2 for executing a logic operation and producing an output logic signal with a first, small logic amplitude pertinent to the Josephson devices, a voltage multiplying circuit 3 supplied with the output logic signal of the Josephson processor 2 for producing an output logic signal having an increased logic amplitude in response to the output logic signal of the Josephson processor 2, and an impedance conversion circuit 4 connected to the voltage multiplying circuit 3 for stabilizing the operation of the voltage multiplying circuit 3. It should be noted that the Josephson processor 2, the voltage multiplying circuit 3 and the impedance conversion circuit 4 are all accommodated in a cooling vessel (not shown) for maintaining the Josephson junctions employed in the superconducting circuit 1 in the superconducting state.

The output of the impedance conversion circuit 4 is then supplied to a semiconductor processing circuit 5 that may be provided outside of the cooling vessel. Thereby, the voltage multiplying circuit 3 and the impedance conversion circuit 4 form an output driver circuit 1' that converts the output of the Josephson processor 2 to a signal suitable for processing by the semiconductor processing circuit 5. The impedance conversion circuit 4 has a high input impedance such that the operation of the voltage multiplying circuit 3 is not influenced by the diversion of current to the semiconductor processing circuit.

Figure 4:
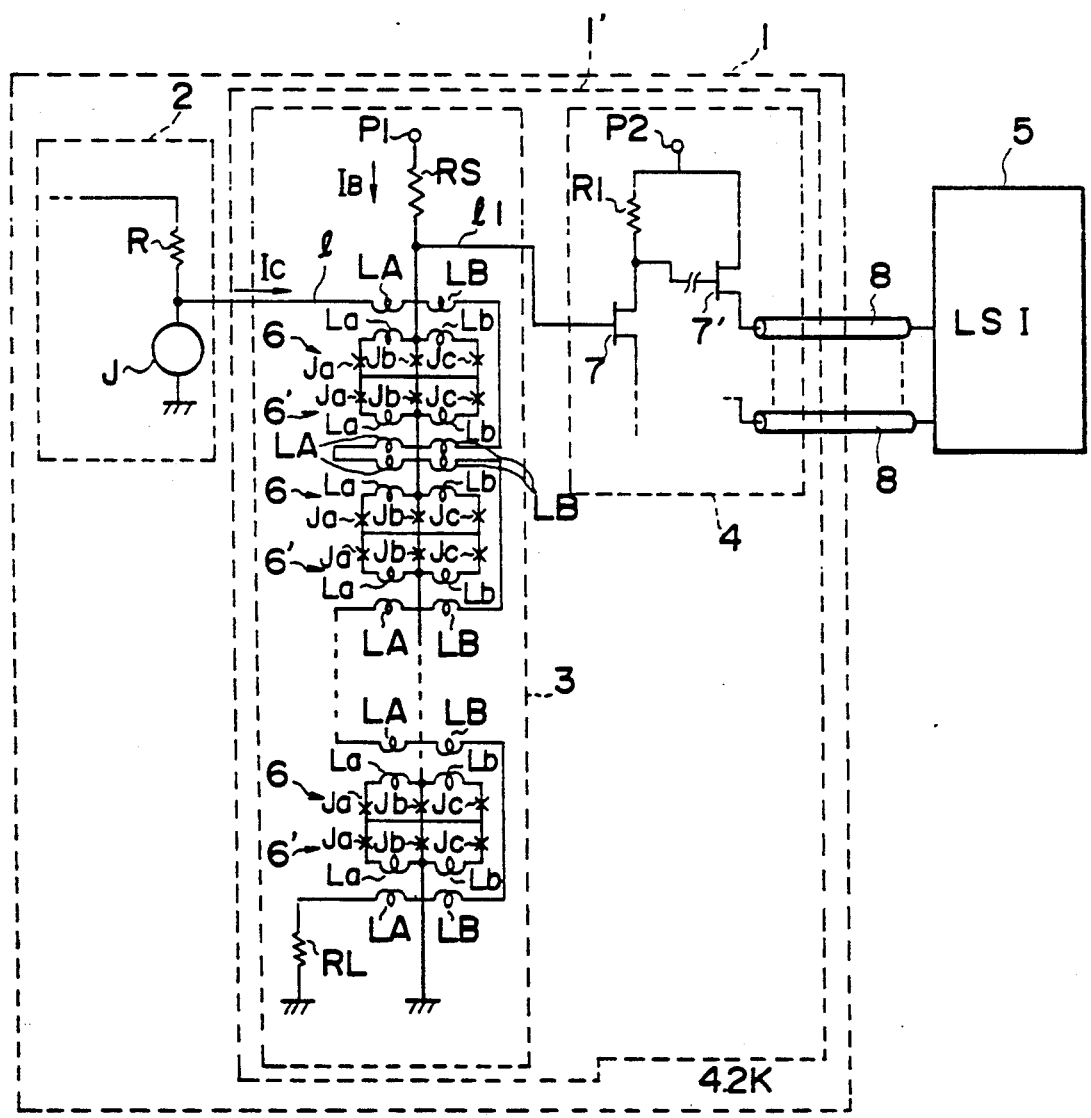
FIG. 4 is a circuit diagram showing a voltage multiplying part of the superconducting circuit of FIG. 3 according to a first embodiment of the present invention.

FIG. 4 shows the detailed construction of the output driver circuit 1', particularly of the voltage multiplying circuit 3 according to a first embodiment of the present invention. In FIG. 4 as well as in FIGS. 7 and 8 to be described later, the Josephson processor 2, the impedance conversion circuit 4 and the semiconductor processing circuit 5 are shown only schematically. The construction of the impedance conversion circuit 4 is described later in detail. The Josephson processor may have the known construction of the IIR filter, for example and includes one or more Josephson devices schematically shown at J. Further, the semiconductor processing circuit 5 may have any known construction and usually is supplied with input logic signals via a low impedance coaxial cables 8.

Referring to FIG. 4, the voltage multiplying circuit 3 includes a number of Josephson interferometer logic (JIL) gates 6 and 6' each including two inductances La and Lb connected in series and three Josephson junctions Ja, Jb and Jc connected in parallel. More specifically, each JIL gate 6 has the inductances La and Lb with respective first ends connected to each other to form a center node, and a bias current IB is supplied from a terminal P1 to the center node via a resistance Rs. Further, the Josephson junction Jb has a first end connected to the center node, the Josephson junction Ja has a first end connected to a second, opposing end of the inductance La, and the Josephson junction Jc has a first end also connected to a second end of the inductance Lb. Furthermore, each Josephson junction Ja, Jb and Jc has a second end and the the second ends are connected with each other to form the superconducting interferometers.

The JIL gate 6' next to the foregoing JIL gate 6 has the construction identical with that of the JIL gate 6 except that the second ends of the Josephson junctions Ja-Jc are shared with the Josephson junctions Ja-Jc of the JIL gate 6 and the bias current is supplied from the JIL gate 6 via the Josephson junctions Ja-Jc. Thus, the JIL gate 6 and the JIL gate 6' are arranged to form a pair, and the bias current Ib is passed to the next pair via the center node of the JIL gate 6'. The Josephson junctions Ja-Jc may be formed by sandwiching a thin film of aluminum oxide (AlOx) by a pair of Nb superconducting layers as usual.

The JIL gate 6 and 6' in FIG. 4 (34 in all in the illustrated example) are coupled magnetically to an external control line 1 extending from an output terminal of the Josephson processor 2 and grounded via a load resistance RL, wherein the control line 1 includes a number of inductances each consisting of a pair of inductances, LA and LB, such that the inductances are connected in series in correspondence to the JIL gates 6 and 6'. Thus, in each pair of the JIL gates formed from the gates 6 and 6', the inductances La of the JIL gates 6 and 6' are magnetically coupled to the inductances LA and the inductances Lb of the JIL gate 6 and 6' are magnetically coupled to the inductances LB.

Figure 5:
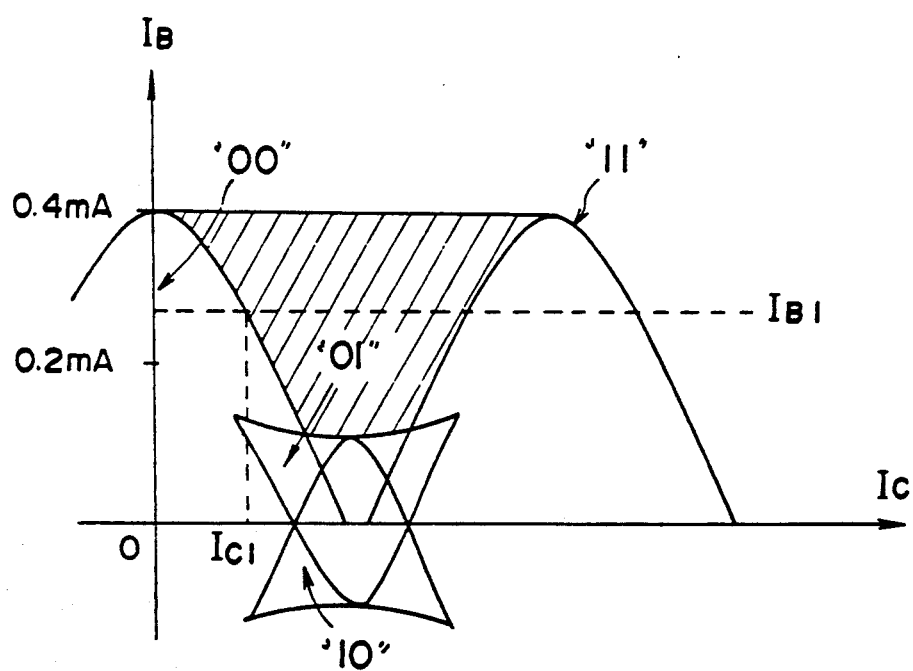
FIG. 5 is a diagram showing the threshold characteristic of the circuit of FIG. 4.

FIG. 5 shows the static characteristic of the JIL gates 6 and 6' for the case that the Josephson jucntions Ja and Jc have the critical current of 0.1 mA, the Josephson junction Jb has the critical current of 0.2 mA, and the inductances La and Lb both have an inductance value of 3.4 pH. It should be noted that this drawing plots the critical current Io of the gate 6 or 6' as a function of the current IC flowing through the control line 1. It should be noted further that the maximum bias critical IoM that can be supplied without inducing the transition of the JIL gates takes a value of about 0.4 mA with the foregoing setting of the parameters.

As shown in FIG. 5, there appear four distinct modes "00," "01," "10" and "11," wherein the mode "00" corresponds to the case where no flux quantum is stored in the JIL gate 6 or 6' and corresponds to the logic value "0." The mode "01" and the mode "10," on the other hand, correspond to the case where one flux quantum is stored in one of the first superconducting loop that is formed in the JIL gate 6 or 6' by the inductance La and the Josephson junctions Ja and Jb, and the second superconducting loop formed in the same JIL gate by the inductance Lb and the Josephson junctions Jb and Jc. Further, the mode "11" represents the characteristic for the case where both the first and second superconducting loops store a flux quantum. It should be noted that the region hatched in FIG. 5 indicates the region wherein the Josephson junctions forming the JIL gate cause the transition to the finite voltage state. This region corresponds to a logic value "1".

In operation, the bias current IB is set to a value such as the value IB1 shown in FIG. 5, wherein the value IB1 is determined not to cause the transition to the finite voltage state when there is no input current Ic on the line 1. Thereby, each JIL gate in the voltage multiplying circuit 3 is held in the superconducting state at the beginning.

When there is an incoming current Ic on the line 1, on the other hand, the Josephson junctions in the JIL gate 6 or 6' experiences a transition to the finite voltage state in correspondence to when the current Ic exceeds a threshold level Ic1 that is determined by the characteristic curve as a function of the input current Ic on the line 1. In the circuit 3 wherein a large number of JIL gates are connected in series, the gate that has the smallest IC1 value causes the transition first followed by other JIL gates. It should be noted that the voltage multiplying circuit 3 produces the output signal on a line 11 connected to the resistance Rs as a voltage corresponding to the sum of the voltages appearing in each JIL gate. The magnitude of the voltage thus obtained on the line 11 for the logic value "1" of the output signal of the Josephson processor 2 may be about 100 mV. The output voltage for the logic value "0" is of course zero in correspondence to the superconducting state of the JIL gates.

The voltage multiplying circuit 3 thus obtained has various advantages such as large output voltage, reliable operation, easy increase or decrease of the number of JIL gates 6 and 6', and the like. It should be noted that such a change in the number of the JIL gates can be achieved easily, as the supply of the input current Ic to each JIL gates is accomplished by the single control line 1 that is coupled magnetically to all the JIL gates in series. When the supply of the logic signals to the JIL gates is achieved by the parallel fan-out construction of the line 1, on the other hand, the current that is supplied to each JIL gates would change depending on the number of the JIL gates involved, and it is not easy to change the number of the JIL gates and hence the magnitude of the voltage magnification.

Figure 6A:
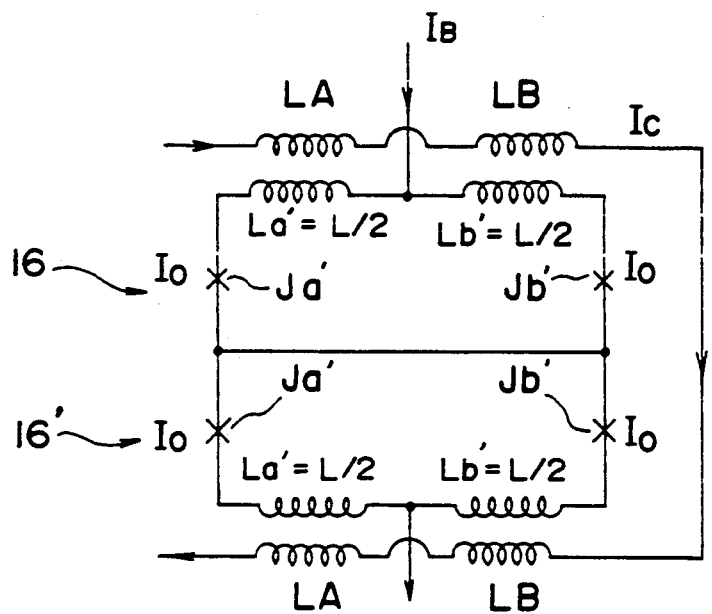
FIGS. 6(A) and 6(B) are diagrams respectively showing a circuit diagram of fundamental part of the voltage multiplying part of FIG. 4 configured according to a second embodiment of the present invention and a diagram showing the threshold characteristic of the voltage multiplying part of the second embodiment.
Figure 6B:
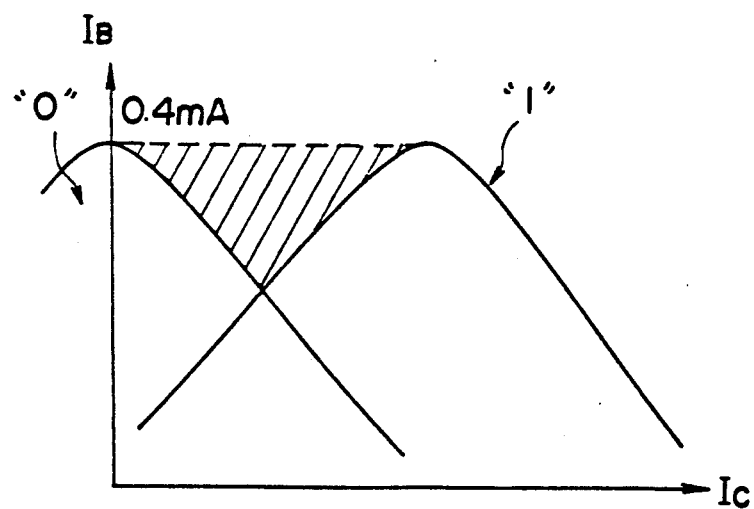

FIGS. 6(A) and 6(B) show a second embodiment of the present invention, wherein the JIL gates 6 and 6' of FIG. 4 are replaced with JIL gates 16 and 16' that involve only two Josephson junctions Ja' and Jb'. Thus, each JIL gate 16 or 16' is formed from inductances La' and Lb' connected similarly to the inductances La and Lb of the first embodiment such that the bias current IB is supplied to a node where the first ends of the inductances La' and Lb' are connected to each other. On the other hand, the Josephson junctions Ja' and Jb' shunt the second ends of the inductances La' and Lb', and the JIL gates 16 and 16' are arranged similarly to the JIL gates 6 and 6' of the first embodiment such that the Josephson junction Ja' of the JIL gate 16 and the Josephson junction Ja' of the JIL gate 16' share the ends that are opposite to those ends connected to the inductance La' of the JIL gates 16 and 16'.

FIG. 6(B) shows the characteristic of the JIL gates 16 and 16' wherein both Josephson junctions Ja' and Jb' have a critical current Io set to 0.2 mA and both inductances La' and Lb' have a value L/2 where L is set to 5.18 pH. With the foregoing setting of the parameters, the maximum critical current IoM that can flow without inducing the transition of the JIL gates 16 and 16' takes a value of 4.0 mA in correspondence to the case of FIG. 5. In FIG. 6(B), it should be noted that the curve designated as "0" represents the threshold characteristic current for a mode wherein no flux quantum is stored in the superconducting loop forming the JIL gate 16 or 16' while the curve designated as "1" represents the threshold bias current for a mode wherein one flux quantum is held in the superconducting loop forming the JIL gate. It should be noted that the region provided with hatching represents the region where the Josephson junctions forming the JIL gate have caused the transition to the finite voltage state.

Thus, a similar voltage multiplication operation is obtained in the second embodiment with the JIL gates 16 and 16' used in place of the JIL gates 6 and 6' of the first embodiment. It should be noted, however, that the construction of the first embodiment is preferable as the first embodiment provides a wider operational margin because of the wider region (hatched in FIG. 5 and FIG. 6(B)) for the transition to the finite voltage state.

Figure 7:
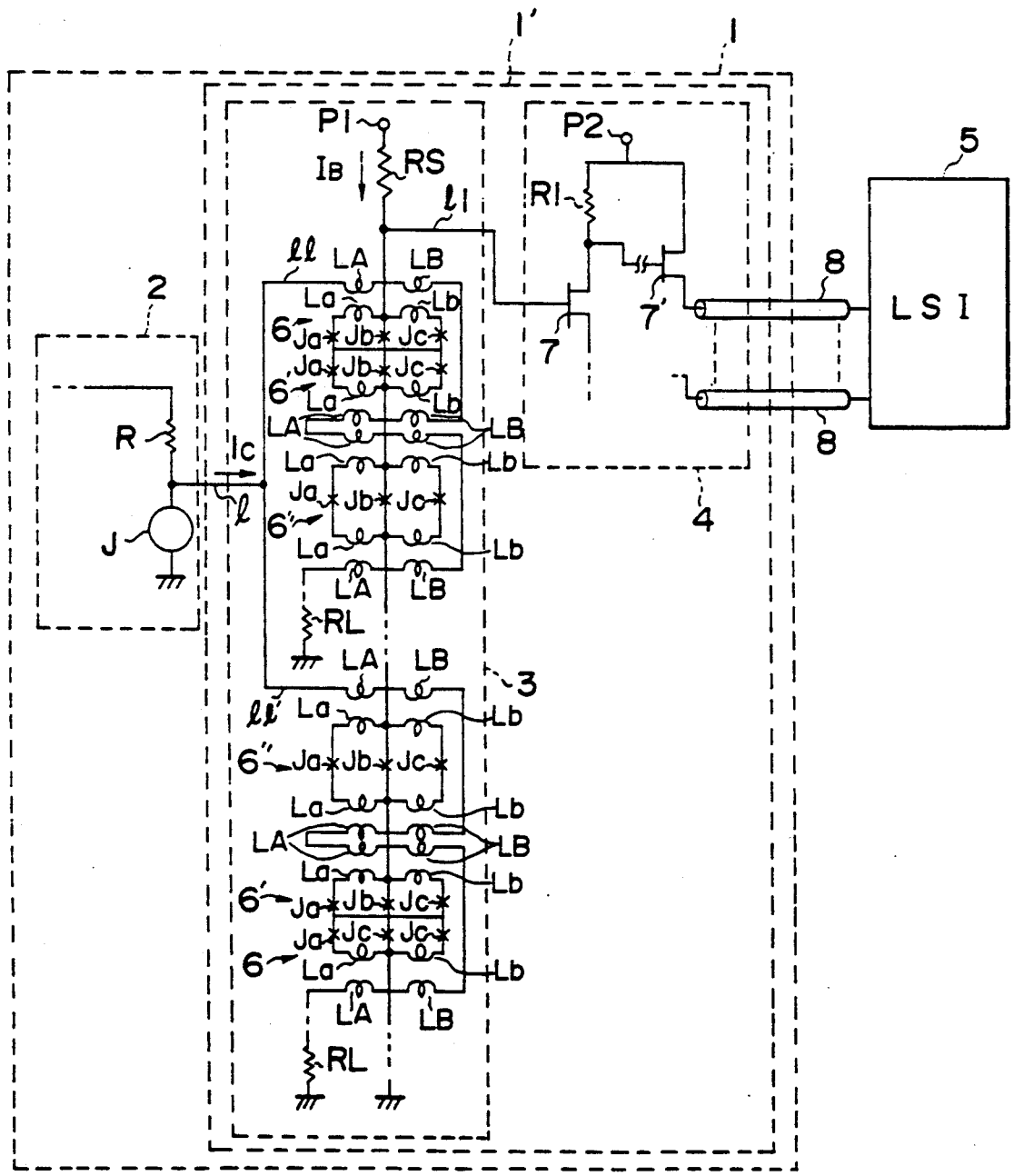
FIG. 7 is a circuit diagram similar to FIG. 4 showing a third embodiment of the present invention corresponding to a modification of the first embodiment circuit of FIG. 4.

FIG. 7 shows the construction of the voltage multiplying circuit 3 according to a third embodiment of the present invention. In FIG. 7, the portions corresponding to those parts described already are given identical reference numerals and the description thereof will be omitted.

In this embodiment, the control line 1 of the first embodiment is branched into a first control line 11 and a second control line 11', and the JIL gates 6 and 6' (thirty four in all) are grouped into a first group including seventeen JIL gates 6 and 6' and a second group also including seventeen JIL gates 6 and 6'. The first control line 11 is coupled to the JIL gates 6 and 6' in the first group sequentially while the second control line 11' is coupled to the JIL gates 6 and 6' in the second group sequentially. In this construction, the length of the line 11 or 11' is reduced to about one-half and the delay in the signal caused by the inductance of the control line is reduced significantly.

Figure 8:
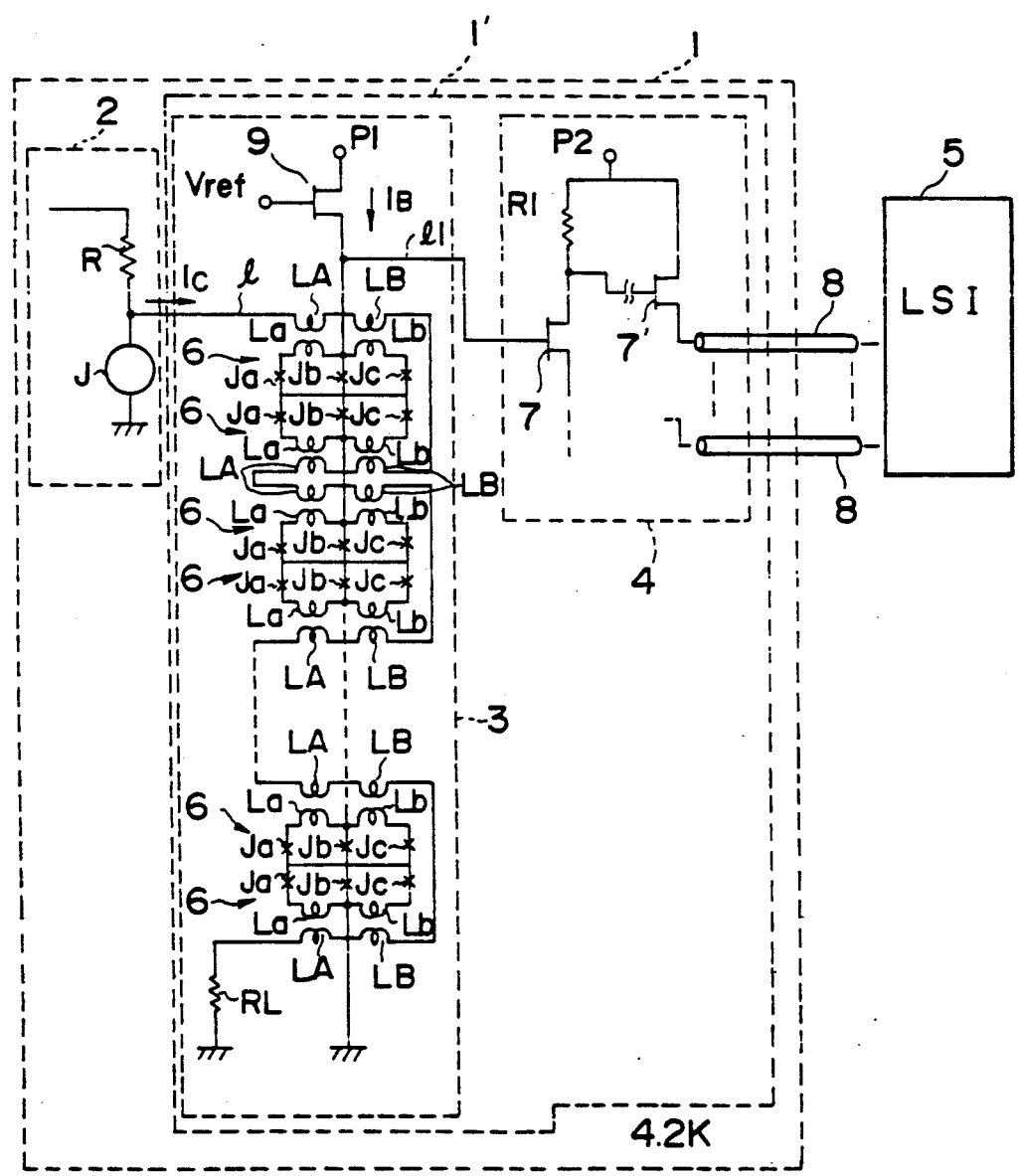
FIG. 8 is a circuit diagram similar to FIG. 4 showing a fourth embodiment of the present invention corresponding to another modification of the first embodiment circuit of FIG. 4.

In the foregoing first through third embodiments, the resistance Rs for supplying the bias current IB may be replaced by an active device such as a transistor 9 as shown in a fourth embodiment shown in FIG. 8. Thus, the embodiment of FIG. 8 shows a modification of the first embodiment. As the construction and operation are obvious, further description thereof will be omitted. Compound transistors such as HEMT (high electron mobility transistors), HBT (heterojunction bipolar transistors), MESFET (metal-semiconductor field effect transistors), and the like that are capable of operating under the low temperature environment of liquid helium, may be employed for the transistor 9.

Figure 9:
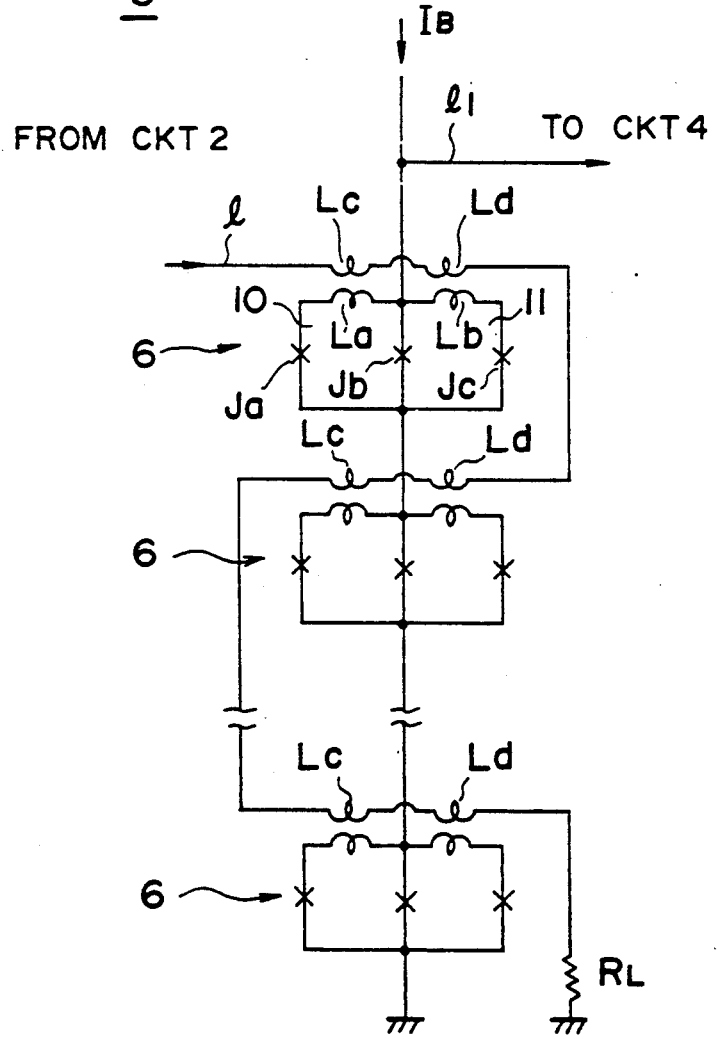
FIG. 9 is a circuit diagram showing the voltage multiplying part according to a fifth embodiment of the present invention.

FIG. 9 shows a fifth embodiment of the present invention corresponding to another modification of the first embodiment circuit of FIG. 4, wherein the same JIL gates 6 are connected in series instead of connecting the JIL gates 6 and 6' alternately. In FIG. 9, only the voltage multiplying circuit 3 is represented. In this case, too, the operational characteristic explained with reference to FIG. 5 holds, and the voltage multiplication can be obtained. In FIG. 9, the portions corresponding to those parts described already with reference to previous drawings are given identical reference numerals and the description thereof will be omitted.

Figure 10:
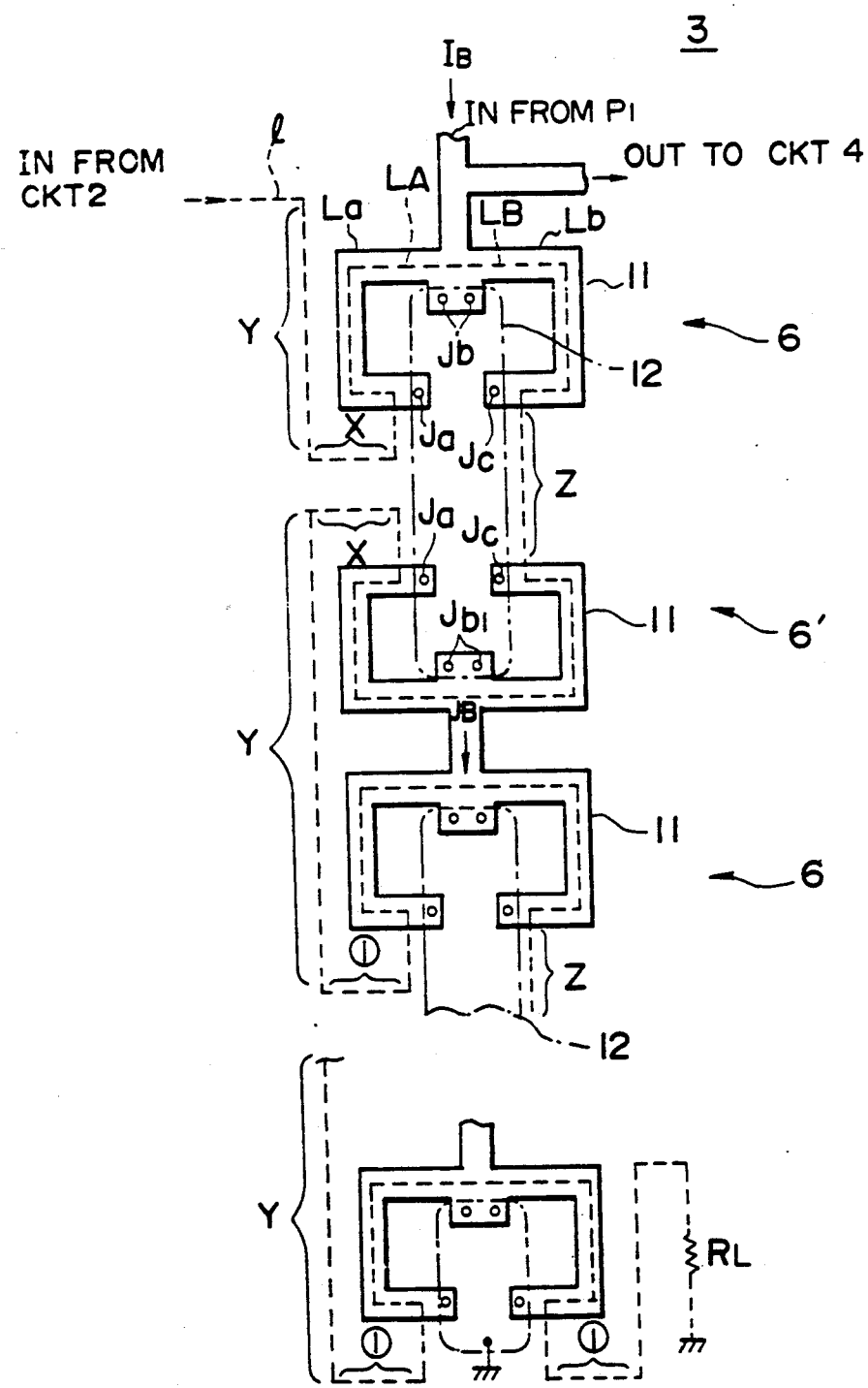
FIG. 10 is a diagram showing the layout pattern of the voltage multiplying part used in the circuit of FIG. 4.
Figure 11:
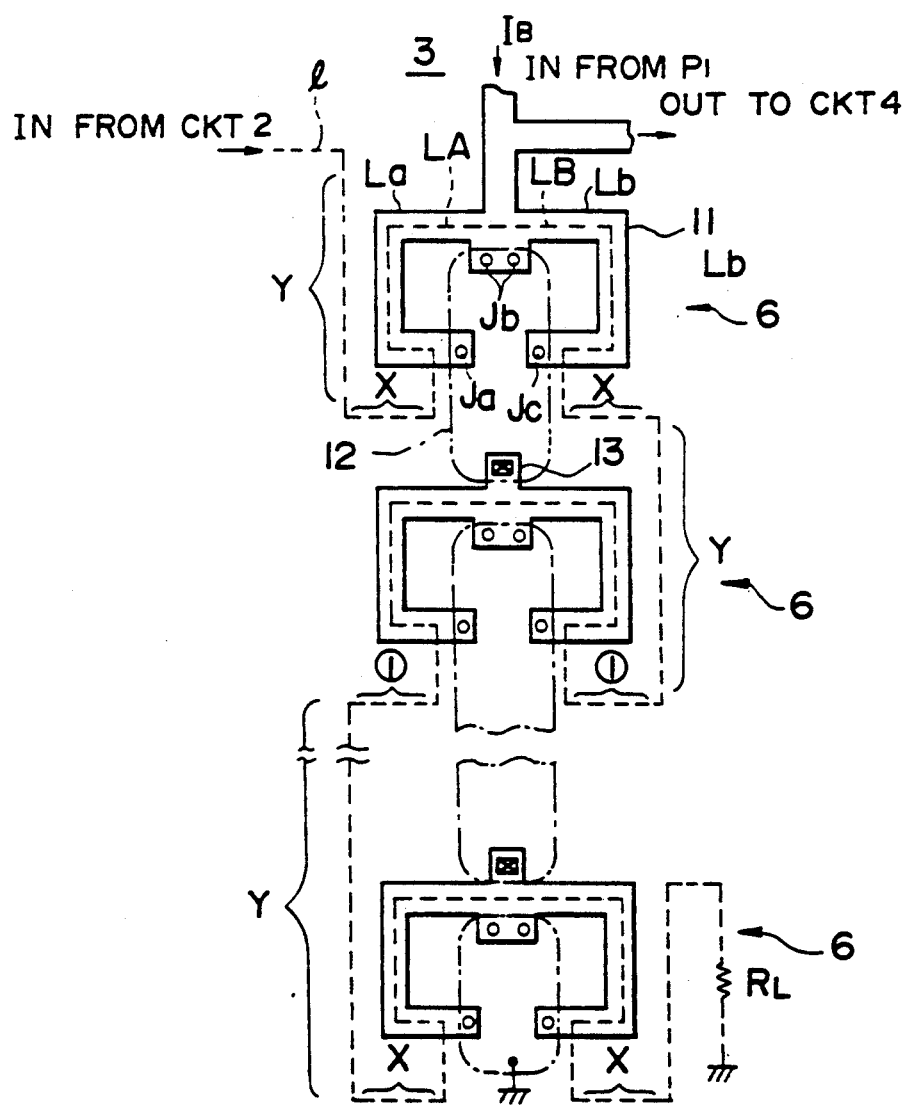
FIG. 11 is a diagram similar to FIG. 10 showing the voltage multiplying part of the circuit of FIG. 9.

FIGS. 10 and 11 are diagrams showing the layout of the voltage multiplying circuit 3 shown in FIG. 4 and FIG. 9, respectively.

Referring to FIG. 10, there is provided a superconductor pattern 11 in correspondence to the inductances La and Lb of the JIL gate 6 such that the pattern 11 is connected to another superconductor pattern 12 via the Josephson junctions Ja, Jb and Jc. Further, the superconductor pattern 12 extends toward the JIL gate 6' such that the pattern 12 is connected to the superconductor pattern 11 forming the inductances La and Lb of the gate 6' via the Josephson junctions Ja, Jb and Jc. Thereby, the bias current IB flows from the superconductor pattern 11 to the superconductor pattern 12 of the JIL gate 6 via the Josephson Junctions Ja, Jb and Jc, from the superconductor pattern 12 of the JIL gate 6 to the superconductor pattern 11 of the JIL gate 6' via the Josephson junctions Ja, Jb and Jc, and further to the superconductor pattern 11 of the next JIL gate 6.

In the layout of FIG. 10, the control line 1, formed by a superconductor strip, is coupled magnetically to the superconductor strip, is coupled magnetically to the superconductor pattern 11 of the JIL gate 6 by forming a loop that coincides to the superconductor pattern 11 with separation therefrom by an insulator layer. The control line 1 extends further to the JIL gate 6' to form a loop that coincides to the superconductor pattern 11 of the gate 6'. Further, the control line 1 extends to the next JIL gate 6 where the line 1 forms another loop for coupling with the superconductor pattern 11 forming the JIL gate 6. In the layout pattern of FIG. 10, it should be noted that there are formed extraneous paths in the line 1 in those parts designated as X, Y and Z as illustrated. These extraneous paths form a parasitic inductance and hence, the construction of the first embodiment is, although successful in achieving the reliable operation for the voltage multiplication, not satisfactory from the view point of the operational speed of the Josephson circuits. The same problem exists also in the embodiment of FIG. 9. As can be seen in FIG. 11, there appear extraneous paths X and Y that causes a delay in the propagation of the signal on the line 1. In FIG. 11, the portions corresponding to those of FIG. 10 are given identical reference numerals and the description thereof will be omitted. It should be noted, in FIG. 11, that the superconductor pattern 12 of one JIL gate 6 is connected to the superconducting pattern 11 of the next JIL gate 6 via a contact hole 13.

Next, a sixth embodiment of the present invention for minimizing the foregoing problem of delay will be described with reference to FIGS. 12 and 13.

Figure 12:
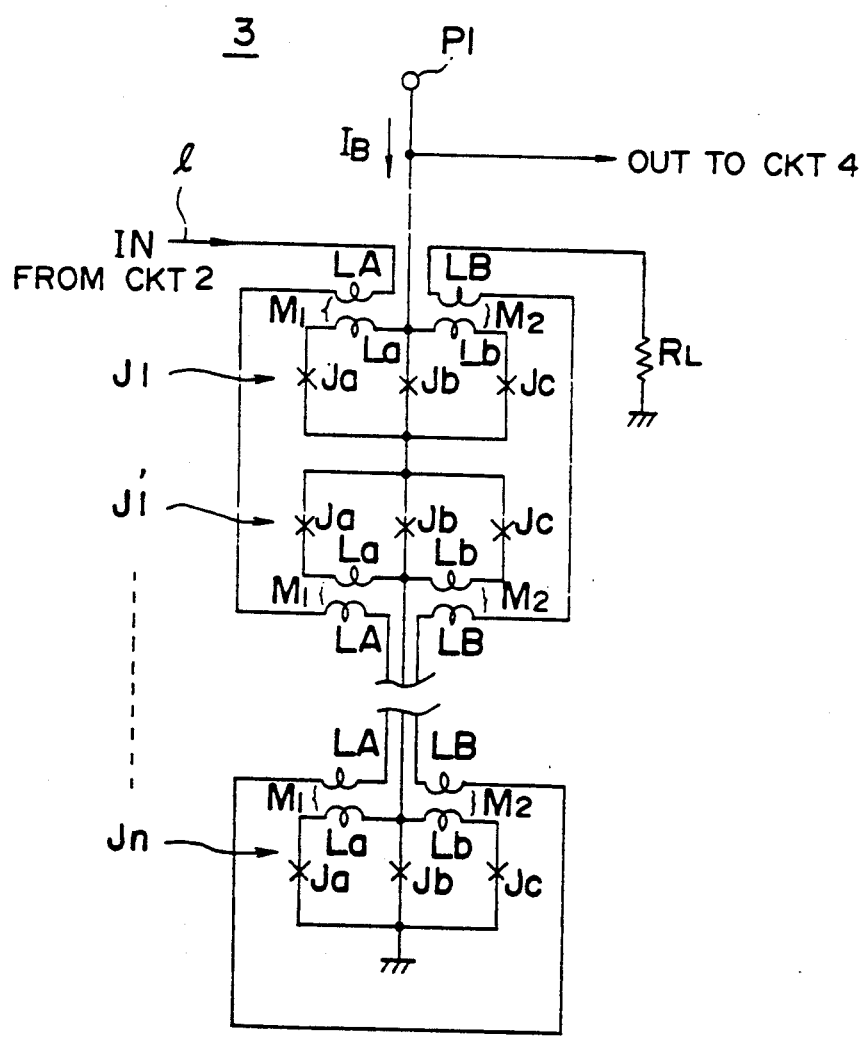
FIG. 12 is a circuit diagram showing the voltage multiplying part according to a sixth embodiment of the present invention.

Referring to FIG. 12, the control line 1 includes a number of coupling inductances LA connected consecutively in series and a number of coupling inductances LB also connected consecutively in series after the inductances LA, wherein each inductance LA is coupled magnetically to the corresponding inductance La of the corresponding JIL gate and each inductance LB is coupled magnetically to the corresponding inductance Lb of the corresponding JIL gate. Each of the JIL gates J1, J1', ... Jn has a construction identical with the JIL gates described previously and further description about the operation of the voltage multiplying circuit will be omitted.

Figure 13:
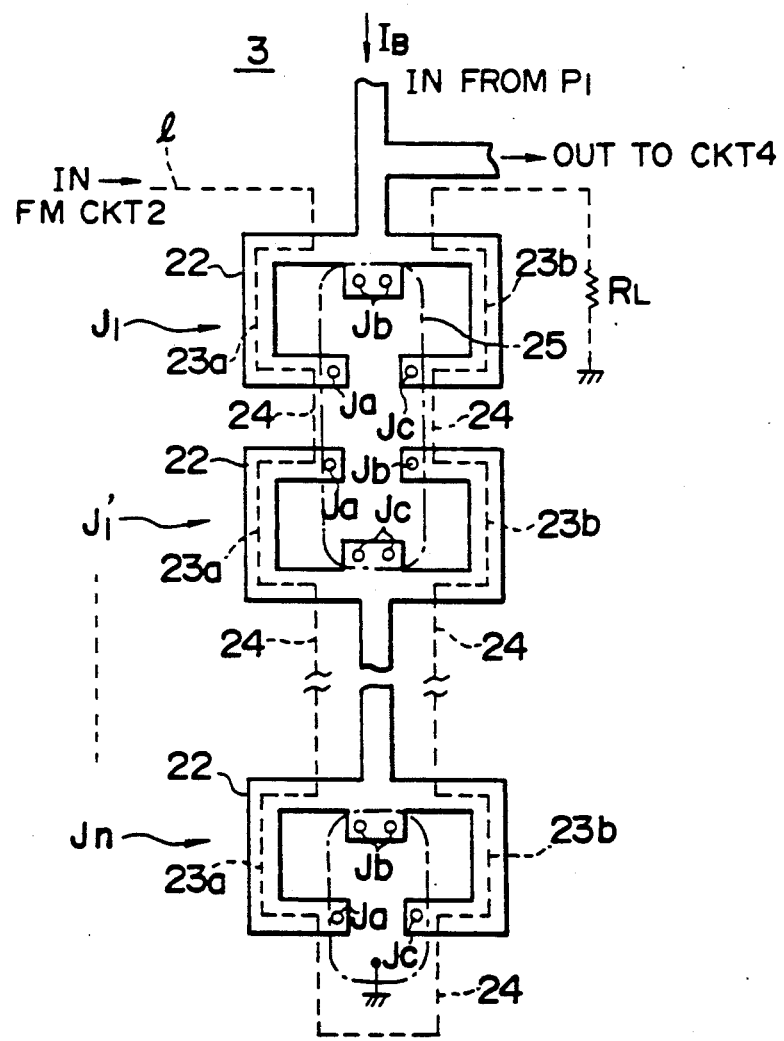
FIG. 13 is a layout pattern of the voltage multiplying circuit of FIG. 11.

FIG. 13 shows the layout pattern of the circuit of FIG. 12. Referring to FIG. 13, each of the JIL gates J1, J1', ... Jn includes a superconductor pattern 22 corresponding to the superconductor pattern 11 of FIG. 10 forming the inductances La and Lb, and the superconductor pattern 22 is supplied with the bias current IB from teh terminal P1. The bias current IB is then supplied to a superconductor pattern 25 corresponding to the superconductor pattern 12 of FIG. 10 via the Josephson junctions Ja, Jb and Jc. The bias current IB supplied to the superconductor pattern 25 is then passed to the superconductor pattern 22 forming the inductances LA and LB of the JIL gate J1'. Further, the bias current IB is supplied to the JIL gates of the next stage and finally reaches the last JIL gate Jn.

In this construction, the control line 1 is coupled magnetically to the JIL gates J1, J1', ... Jn at the parts 23a, 23b and 24, wherein the part 23a is coupled to the superconducting pattern 22 forming the inductance La in each JIL gate, and the part 23b is coupled to the superconducting pattern 22 forming the inductance Lb of each JIL gate. Further, the part 24 extends between the part 23a for one JIL gate and the part 23a for the next JIL gate. More specifically, the part 23a and the part 24 appear alternately in the left half of the line 1 while the part 23b and the part 24 appear alternately in the right half of the line 1. Further, the left half and the right half of the line 1 are connected by the part 24 at the bottom as illustrated. In the construction of FIG. 13, it should be noted that the extraneous inductances accompanied with the portions X, Y or Z of FIG. 10 or FIG. 11 are no longer formed and the circuit operates with an improved response.

Figure 14:
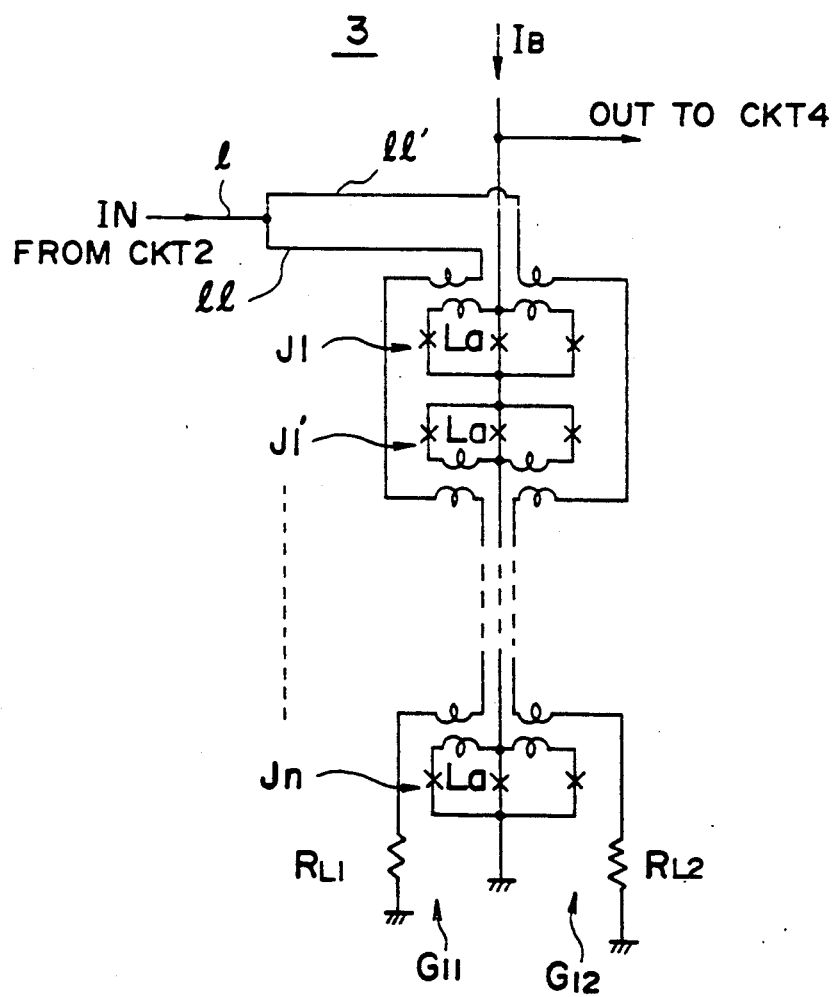
FIG. 14 is a circuit diagram showing a seventh embodiment of the present invention corresponding to a modification of the voltage multiplying circuit of FIG. 12.

FIG. 14 shows a seventh embodiment of the present invention corresponding to a modification of the circuit 3 of FIG. 12, wherein the control line 1 is divided into a first line 11 and a second line 11' such that the line 11 is coupled to the inductances La at the left of the JIL gates J1, J1', ... sequentially and grounded finally via a resistance RL1, while the line 11' is coupled to the inductances Lb at the right of the JIL gates sequentially and grounded via a resistance RL2. It should be noted that the line 11 includes the inductances LA connected one after another in series while the line 11' includes the inductances LB connected one after another in series. According to the present embodiment, the response of the circuit 3 is further improved because of the reduced signal path for coupling the logic signals on the line to the JIL gates.

Next, an eighth embodiment of the present invention relating to the impedance conversion circuit 4 that has been hitherto shown only schematically will be described. It should be noted that, for the reliable operation of the voltage multiplying circuit 3, the circuit that follows immediately the circuit 3 is required to have a high impedance sufficiently high such that no diversion of the drive current IB occurs during the switching operation of the Josephson junctions Ja, Jb and Jc forming the JIL gates.

Figure 15:
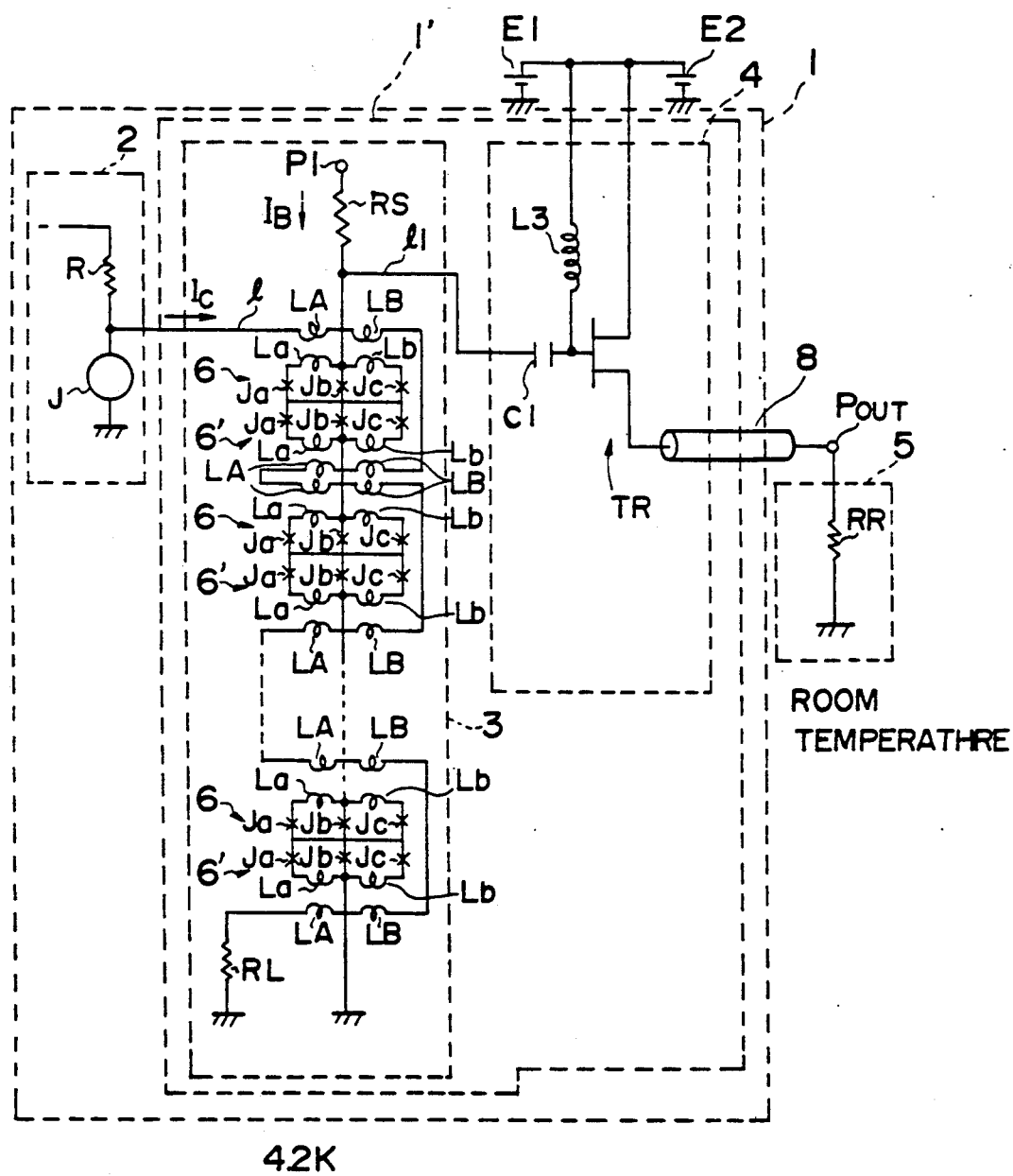
FIG. 15 is a circuit diagram showing an eighth embodiment of the present invention about the impedance conversion part of the circuit of FIG. 3.

Referring to FIG. 15, the output of the voltage multiplying circuit 3 on the line 11 is supplied to a gate of a HEMT designated as TR via a capacitance C1. The HEMT TR has a drain connected to a d.c. voltage source E2 and controls the current flowing therethrough in response to the logic output of the voltage multiplying circuit 3 that is supplied to the gate of the HEMT together with a bias voltage thus is supplied from another d.c. voltage source via an inductance L3. Thereby, an output current is obtained at a source of the HEMT TR, and the current thus obtained is supplied to the secmiconductor processor 5 via the coaxial cable or the strip line 8 that may be the one used commonly having the impedance of 50 ohms. In FIG. 15, the impedance of the processor 5 is schematically shown by a resistance RR.

In the construction of FIG. 15, a very large impedance in the order of several megohms or more is obtained at the input side of the circuit 4 while the circuit 4 provides a low impedance such as 50 ohms for output connection. Thereby, the switching operation of the Josephson junctions included in the JIL gates forming the voltage multiplying circuit 3 is not influenced at all by the output current supplied to the circuit 4 and a reliable operation of the circuit 3 is guaranteed. On the other hand, the circuit 4 provides the low output impedance suitable for driving the semiconductor processor 5 that follows the superconducting circuit 1 via the coaxial cable or the strip line having the relatively low impedance. The transistor TR in the circuit 4 is not limited to HEMT but any of he HBT, MESFET using a GaAs active layer or even silicon MOSFET that operates under the environment of liquid helium temperature may be employed.

Figure 16:
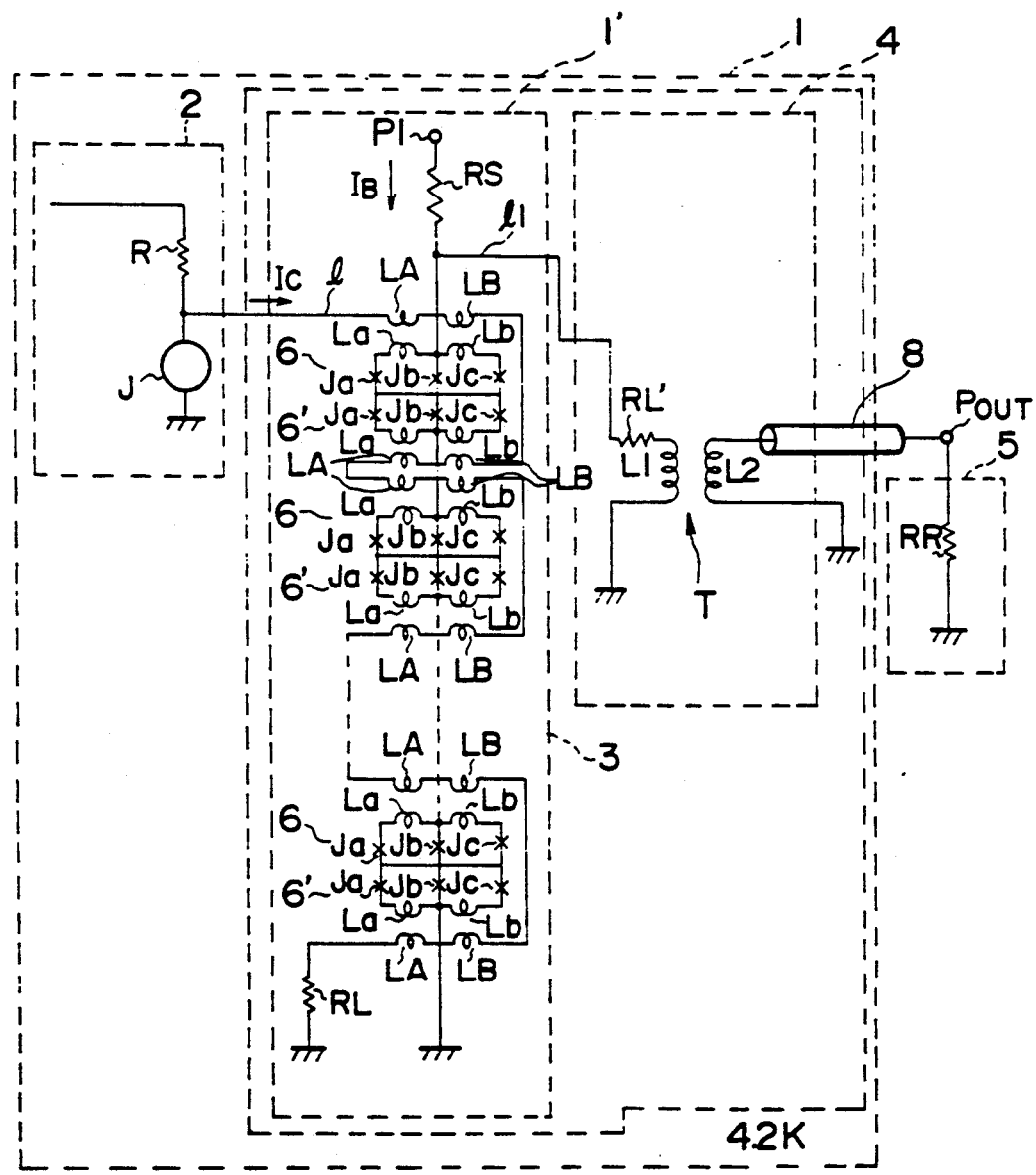
FIG. 16 is a circuit diagram showing a ninth embodiment of the present invention also about the impedance conversion part of FIG. 3.

FIG. 16 shows a ninth embodiment of the present invention wherein a transformer T is used for the impedance conversion. The transformer T has a primary side superconducting winding L1 connected to the line 11 via a resistance RL' and a secondary side superconducting winding L2 coupled magnetically to the winding L1. The superconducting winding L1 has a number of turns that is at least one time larger than the number of turns of the superconducting winding L2 and provides a large inpedance against the line 11. On the other hand, a low output impedance suitable for taking out the output via the low impedance coaxial cable 8 is obtained at the secondary side superconducting winding L2.

FIG. 17 shows a tenth embodiment wherein HBT TR1 and TR2 are used to form an ECL gate, and the output of the ECL gate is supplied to the coaxial cable 8 via another HBT 8 having an emitter-follower construction. In the illustration example, the logic amplitude of the input logic signal from the voltage multiplying circuit 3 has a value of about 0.1 volts, and the collector current of the transistor TR1 flows through a path including a resistance R1 of 100 ohms, the resistance R2 of 25 ohms and a resistance R5 of 250 ohms. Similarly, the collector current of the transistor TR2 flows through a resistance R3 of 100 ohms and then through a resistance R4 of 25 ohms and merges with the collector current of the transistor TR1 at the resistance R5. Thereby, about 4 mA of total current flows through the resistance R5. The incoming logic signal from the voltage multiplying circuit 2 is supplied to a base of the transistor TR1 while the transistor TR2 is supplied with a reference voltage of 0.05 sistor TR2 is supplied with a reference voltage of 0.05 volts at a base thereof. The transistor TR3, in turn, takes over the output of the ECL gate formed at the collector of the transistor TR1 at the base thereof and supplies the same at the emitter in the emitter-follower construction. For this purpose the emitter of the transistor TR3 is connected to the voltage source VEE via a resistance R6 of about 250 ohms. Thereby a collector current of 4 mA flows through the transistor TR3. In this construction, the input logic amplitude of about 0.1 volts is amplified further, and a logic amplitude of about 0.2 volts is obtained at the coaxial cable 8 forming an output terminal of the circuit 4. Because of the emitter-follower construction of the transistor TR3, a low output impedance matching the impedance of 50 ohms of the coaxial cable is achieved. On the other hand, a large input impedance is realized at the base of the transistor TR1.

With the provision of the impedance conversion circuit 4, the operation of the voltage multiplying circuit 3 is stabilized irrespective of the input impedance of the semiconductor processor 5 that is connected after the superconducting circuit 1.

Further, the present invention is not limited to the embodiments described heretofore, but various variations and modifications may be made without departing from the scope of the invention.

What is claimed is:

1. A superconducting circuit for performing a logic operation and producing an output indicative of the result of the logic operation with a logic amplitude suitable for processing by an external circuit, comprising:

a Josephson processing circuit, comprising one or more Josephson devices, for performing the logic operation and for producing an output logic signal having a first logic amplitude corresponding to the logic operation;

voltage amplification means, supplied with the output logic signal from the Josephson processing circuit, for producing an output signal having a second logic amplitude that is substantially larger than the first logic amplitude, said voltage amplification means comprising a plurality of superconducting quantum interference devices each having a control line coupled magnetically thereto, each of said superconducting quantum interference devices being supplied with a bias current for causing a transition from a superconducting state to a finite voltage state in response to a signal on the control line, said superconducting quantum interference devices being connected in series such that the bias current flows consecutively through the plurality of superconducting quantum interference devices, said output logic signal of the Josephson processing circuit being passed consecutively through the control line of the plurality of superconducting quantum interference devices, for causing the transition from the superconducting state to the finite voltage state in the superconducting quantum interference devices, each superconducting quantum interference device producing an elemental logic amplitude in response to the transition to the finite voltage state, said voltage amplification means producing the output signal having the second logic amplitude as a sum of the elemental logic amplitudes of the plurality of superconducting quantum interference devices; and impedance conversion means supplied with the output signal of the voltage amplification means for producing the output of the superconducting circuit with an output impedance suitable for transferring to the external circuit, said impedance conversion means having an input impedance, when viewed from the voltage amplification means, which is sufficiently large such that the transition of the superconducting quantum interference devices in the voltage amplification means is not influenced by the presence of the impedance conversion means.

2. A superconducting circuit as claimed in claim 1 in which each of said plurality of superconducting quantum interference devices comprises a first inductance and a second inductance having respective first ends connected to each other at a center node, a first Josephson junction having a first terminal connected to the center node, a second Josephson junction having a first terminal connected to a second, opposing end of the first inductance, a third Josephson junction having a first terminal connected to a second, opposing end of the second inductance, said first, second and third Josephson junctions having respective second terminals opposite to the first terminals such that the second terminals are connected commonly with each other to form the superconducting quantum interference devices, wherein said bias current is supplied to each superconducting quantum interference device at the center node and passed to the next superconducting quantum interference device at the second end of the first through third Josephson junctions.

3. A superconducting circuit as claimed in claim 1 in which each of said plurality of superconducting quantum interference devices comprises a first part including a first inductance and a second inductance having respective first ends connected each other at a center node, a first Josephson junction having a first terminal connected to the center node, a second Josephson junction having a first terminal connected to a second, opposing end of the first inductance, a third Josephson junction having a first terminal connected to a second, opposing end of the second inductance, said first, second and third Josephson junctions having respective second terminals opposite to the first terminals such that the second terminals are connected commonly with each other to form superconducting interference devices, a second part including a first inductance and a second inductance having respective first ends connected each other at a center node, a first Josephson junction having a first terminal connected to the center node, a second Josephson junction having a first terminal connected to a second, opposing end of the first inductance, a third Josephson junction having a first terminal connected to a second, opposing end of the second inductance, said first, second and third Josephson junctions having respective second terminals opposite to the first terminals such that the second terminals are connected commonly with each other to the superconducting quantum interference devices, said second terminals of the first through third Josephson junctions of the first part being connected to said second terminals of the first through third Josephson junctions of the second part, wherein, in each superconducting quantum interference device, the bias current is supplied to the center node of the first part and passed to the next superconducting quantum interference device via the center node of the second part.

4. A superconducting circuit as claimed in claim 1 in which each of said plurality of superconducting quantum interference devices comprises a first inductance and a second inductance having respective first ends connected to each other at a center node, a first Josephson junction having a first terminal connected to a second, opposing end of the first inductance, and a second Josephson junction having a first terminal connected to a second, opposing end of the second inductance, said first and second Josephson junctions having respective second terminals connected to each other to form the respective superconducting interference device, wherein said bias current is supplied to the center node and passed to the next superconducting quantum interference device via the second terminals of the first and second Josephson junctions.

5. A superconducting circuit as claimed in claim 1 in which said control lines of the plurality of superconducting quantum interference devices are connected in series to form a single signal path, and said output logic signal of the Josephson processing circuit is distributed to all the superconducting quantum interference devices that are coupled magnetically to the single signal path.

6. A superconducting circuit as claimed in claim 3 in which each of said control lines of the plurality of superconducting quantum devices includes a first inductance and a second inductance connected in series, each of said control lines corresponding to the plurality of superconducting quantum interference devices being connected in series to form a single signal path of the output logic signal of the Josephson processing circuit, and wherein, in each superconducting quantum interference device, the first inductance of the control line is coupled magnetically to the first inductance of the superconducting quantum interference device, and the second inductance of the control line is coupled magnetically to the second inductance of the superconducting quantum device.

7. A superconducting circuit as claimed in claim 3 in which each of said control lines of the plurality of superconducting quantum interference devices includes a first inductance and a second inductance respectively coupled magnetically to the first and second inductances of the corresponding superconducting quantum interference device, said control lines being connected in series to form a single signal path of the output logic signal of the Josephson processing circuit, said control lines being connected such that the first inductances of the control lines are connected consecutively to form a first half of the signal path and such that the second inductances of the control lines are connected consecutively to form a second half of the signal path and, wherein said first half and said second half of the signal path are connected in series to complete the single signal path.

8. A superconducting circuit as claimed in claim 1 in which said impedance conversion means comprises a semiconductor circuit having a high input impedance, said semiconductor circuit being supplied with the output signal of the amplification means for producing the output of the superconducting circuit in response to the output signal supplied thereto, and an output cable, having a predetermined impedance, for supplying the output of the superconducting circuit to the external circuit, said predeterimined impedance being determined in accordance with matching the input impedance of the external circuit, said semiconductor circuit comprising a high electron mobility transistor having a gate to which the output signal of the amplification means is supplied, and said high electron mobility transistor having a source-follower construction thereby affording an output impedance thereof which is compatible with the impedance of the output cable.

9. A superconducting circuit as claimed in claim 1 in which said impedance conversion means comprises a semiconductor circuit having a high input impedance, said semiconductor circuit being supplied with the output signal of the amplification means for producing the output of the superconducting circuit in response to the output signal supplied thereto, and an output cable, having a predetermined impedance, for supplying the output of the superconducting circuit to the external circuit, said predetermined impedance being determined in accordance with matching the input impedance of the external circuit, said semiconductor circuit comprising bipolar transistors forming an emitter-coupled logic circuit configured to receive the output signal of the voltage amplification means, and an output buffer circuit comprising a bipolar transistor configured as an emitter-follower and having an output impedance compatible with the impedance of the output cable, and said output buffer circuit being supplied with an output of the emitter-coupled logic for producing the output of the superconducting circuit and supplying the output thereof to the output cable.

10. A superconducting circuit as claimed in claim 1 in which said impedance conversion means comprises a transformer having a primary winding and a secondary winding coupled magnetically with each other and an output cable having a predetermined impedance determined in accordance with matching the input impedance of the external circuit, said primary winding having an impedance set to be equal to the input impedance and sufficiently high such that the transition of the superconducting quantum interference devices of the voltage amplification means is not influenced by the presence of the impedance conversion means, said secondary winding having an impedance set to match the impedance of the output cable.

* * * * *

UNITED STATES PATENT AND TRADEMARK OFFICE
CERTIFICATE OF CORRECTION

PATENT NO. : 5,099,152

DATED : March 24, 1992

INVENTOR(S) : Hideo SUZUKI

It is certified that error appears in the above-identified patent and that said Letters Patent is hereby corrected as shown below:

TITLE PAGE: [57] ABSTRACT:

line 17, after "quantum" insert --interference--.

Col. 2, line 50, change "time" to --timing--;
       line 57, change "in" to --by--;
       line 62, change "appear" to --appears.

Col. 4, line 8, change "part" to --parts--.

Col. 5, line 26, delete "a";
       line 43, delete "the" (second occurrence).

Col. 6, line 21, change "loop" to --loops--;
       line 42, change "experiences" to --experience--;
       line 65, change "gates" to --gate--.

Col. 7, line 2, change "gates" to --gate--.

Col. 8, line 46, delete "is coupled magnetically to the";
       line 47, delete "superconductor strip,".

Col. 9, line 28, change "teh" to --the--.

Col. 10, line 24, change "secmiconductor" to --semiconductor--;
       line 25, after "commonly" insert --and--;
       line 43, change "he" to --the--.

Col. 11, line 10, delete "sistor TR2 is supplied with a";
       line 11, delete "reference voltage of 0.05".

UNITED STATES PATENT AND TRADEMARK OFFICE
CERTIFICATE OF CORRECTION

PATENT NO. : 5,099,152

DATED : March 24, 1992

INVENTOR(S) : Hideo SUZUKI

It is certified that error appears in the above-identified patent and that said Letters Patent is hereby corrected as shown below:

Col. 12, line 46, after "connected" insert --to--;
line 68, after "to" insert --form the--.

Signed and Sealed this

Twelfth Day of October, 1993

Attest:

BRUCE LEHMAN

Attesting Officer

Commissioner of Patents and Trademarks